(12) United States Patent
Ackerman et al.

(10) Patent No.: US 6,887,588 B2
(45) Date of Patent: May 3, 2005

(54) ARTICLE PROTECTED BY THERMAL BARRIER COATING HAVING A SINTERING INHIBITOR, AND ITS FABRICATION

(75) Inventors: John Frederick Ackerman, Laramie, WY (US); Venkat Subramaniam Venkataramani, Clifton Park, NY (US); Irene Spitsberg, Loveland, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/957,843

(22) Filed: Sep. 21, 2001

(65) Prior Publication Data

US 2003/0059633 A1 Mar. 27, 2003

(51) Int. Cl.[7] .................. B32B 15/04; F03B 3/12; C23C 22/05
(52) U.S. Cl. .............. 428/633; 428/632; 428/650; 428/680; 428/699; 428/701; 428/702; 427/596; 427/255.29; 427/255.32; 416/241 B
(58) Field of Search .............. 427/596, 255.29, 427/255.32; 428/615, 621, 632, 633, 650, 655, 670, 680, 678, 687, 469, 699, 701, 702; 416/241 B

(56) References Cited

U.S. PATENT DOCUMENTS 5,876,860 A * 3/1999 Marijnissen et al.
6,103,386 A    8/2000 Raybould et al.
6,203,927 B1 * 3/2001 Subramanian et al.
6,296,945 B1 * 10/2001 Subramanian
6,440,575 B1 * 8/2002 Heimberg et al.
6,544,665 B2 * 4/2003 Rigney et al.

FOREIGN PATENT DOCUMENTS

| EP | 0 783 043 A | 7/1997 |
| EP | 1 225 251 A | 7/2002 |
| WO | WO 01 18277 A1 | 3/2001 |
| WO | WO 01 23642 A2 | 4/2001 |
| WO | WO 02 27066 A | 4/2002 |

* cited by examiner

Primary Examiner—Jennifer McNeil
(74) Attorney, Agent, or Firm—McNees Wallace & Nurick LLC

(57) ABSTRACT

An article protected by a thermal barrier coating system includes a substrate having a substrate surface, and a thermal barrier coating system overlying the substrate. The thermal barrier coating system has a thermal barrier coating formed of a thermal barrier coating material arranged as a plurality of columnar grains extending generally perpendicular to the substrate surface and having grain surfaces. A sintering inhibitor is within the columnar grains, either uniformly distributed or concentrated at the grain surfaces. The sintering inhibitor is lanthanum oxide, chromium oxide, and/or yttrium chromate, mixtures thereof, or mixtures thereof with aluminum oxide.

18 Claims, 4 Drawing Sheets

ARTICLE PROTECTED BY THERMAL BARRIER COATING HAVING A SINTERING INHIBITOR, AND ITS FABRICATION

This invention relates to the thermal barrier coating used to protect an article such as a nickel-base superalloy substrate and, more particularly, to the inhibiting of the sintering between the grains of the thermal barrier coating.

BACKGROUND OF THE INVENTION

A thermal barrier coating system may be used to protect the components of a gas turbine engine that are subjected to the highest material temperatures. The thermal barrier coating system usually includes a bond coat that is deposited upon a superalloy substrate, and a ceramic thermal barrier coating that is deposited upon the bond coat. The thermal barrier coating acts as a thermal insulator against the heat of the hot combustion gas. The bond coat bonds the thermal barrier coating to the substrate and also inhibits oxidation and corrosion of the substrate.

The currently preferred thermal barrier coating is yttria-stabilized zirconia (YSZ), which is zirconia (zirconium oxide) with from about 3 to about 12 percent by weight yttria (yttrium oxide) added to stabilize the zirconia against phase changes that otherwise occur as the thermal barrier coating is heated and cooled during fabrication and service. The YSZ is deposited by a physical vapor deposition process such as electron beam physical vapor deposition. In this deposition process, the grains of the YSZ form as columns extending generally outwardly from and perpendicular to the substrate and the bond coat.

When the YSZ is initially deposited, there are small gaps desirably present between the columnar grains. The gaps serve to accommodate the transverse thermal expansion strains of the columnar grains and also act as an air barrier in the insulator structure. As the YSZ is cycled to elevated temperature during service, these gaps gradually close by a sintering mechanism. As a result, the ability of the YSZ to accommodate thermal expansion strains gradually is reduced, and the thermal conductivity of the YSZ gradually increases by about 20 percent or more. The thickness of the YSZ must initially be greater than would otherwise be desired, to account for the loss of insulating power associated with the rise in thermal conductivity during service.

It has been recognized that the addition of sintering inhibitors to the YSZ reduces the tendency of the gaps between the columnar grains to close by sintering during service of the thermal barrier coating. A number of sintering inhibitors have been proposed. However, these sintering inhibitors have various shortcomings, and there is a need for more effective sintering inhibitors. The present invention fulfills this need, and further provides related advantages.

BRIEF SUMMARY OF THE INVENTION

The present invention provides an article protected by a thermal barrier coating system, and a method for its fabrication. The thermal barrier coating includes effective sintering inhibitors that slow or prevent the closure of the gaps between the columnar grains. The sintering inhibitors are readily introduced into the thermal barrier coating by an infiltration technique.

An article protected by a thermal barrier coating system comprises a substrate having a substrate surface, and a thermal barrier coating system overlying the substrate. The thermal barrier coating system comprises a thermal barrier coating formed of a thermal barrier coating material such as yttria-stabilized zirconia, arranged as a plurality of columnar grains extending generally perpendicular to the substrate surface and having grain surfaces, and a sintering inhibitor within the columnar grains but concentrated at the grain surfaces. The sintering inhibitor is a reaction product of the thermal barrier coating material and an inhibitor precursor material comprising an inhibitor element selected from the group consisting of barium, strontium, tantalum, lanthanum, neodymium, ytterbium, gadolinium, niobium, and mixtures thereof. The sintering inhibitor has a higher melting point than the operating temperature of the gas turbine, typically about 1200° C., and in some cases higher than the melting point of the thermal barrier coating material. Preferably, a bond coat is disposed between the substrate and the thermal barrier coating. The bond coat may be a diffusion aluminide or an aluminum-containing overlay coating, and is most preferably a platinum aluminide.

The sintering inhibitor is not simply a coating on the surface of the thermal barrier coating. Instead, the sintering inhibitor is a reaction product of the thermal barrier coating material and the inhibitor precursor material. Because the sintering inhibitor is such a reaction product, it represents a reduced energy state with reduced chemical activity, as compared with the reactants. The sintering inhibitor therefore acts to lower the chemical activity at the surface of the thermal barrier coating material and consequently the tendency to sinter. The sintering inhibitor is preferably a stoichiometric reaction product compound, as such stoichiometric compounds represent the lowest energy states. The sintering inhibitor may be a non-stoichiometric reaction product having a reduced energy state as compared with the reactants, although the non-stoichiometric form is less preferred.

Three families of reaction-product sintering inhibitors are of most interest at the present time, for the case of the preferred yttria-stabilized zirconia (YSZ) thermal barrier coating, wherein zirconia is the major oxide present. First, oxide compounds of Group II inhibitor elements such as barium and strontium reacted with the material of the thermal barrier coating form zirconates with a perovskite structure. Examples include barium-zirconium-oxide, and particularly the barium zirconate compound, and strontium-zirconium-oxide, and particularly the strontium zirconate compound. Second, oxide compounds of Group III large-cation inhibitor elements such as lanthanum, neodymium, ytterbium, and gadolinium reacted with the material of the thermal barrier coating form zirconates with a pyrochlore structure. Examples include lanthanum-zirconium-oxide, and particularly the lanthanum zirconate compound, neodymium-zirconium-oxide, and particularly the neodymium zirconate compound, ytterbium-zirconium-oxide, and particularly the ytterbium zirconate compound, and gadolinium-zirconium-oxide, and particularly the gadolinium zirconate compound. Third, oxide compounds of Group V inhibitor elements such as tantalum and niobium reacted with the material of the thermal barrier coating form tantalates and niobates of zirconium. Examples include tantalum-zirconium-oxide, and particularly zirconium tantalate compound, and niobium-zirconium-oxide, and particularly zirconium niobate compound.

Reaction product mixtures of oxides from within a single one of these families, or mixtures of oxides between these families are operable, as long as the reaction products meet the other requirements set forth herein. Reacted mixtures of oxides of one or more of these families and other oxide-formers are also operable, as long as the reaction products meet the other requirements set forth herein. Oxides of any of these inhibitor elements and including yttria, the stabilizing element in YSZ, may form, as long as the reaction products meet the other requirements set forth herein. Examples include niobium-yttrium-oxide, and particularly yttrium niobate compound, and tantalum-yttrium-oxide, and particularly yttrium zirconate compound. When the YSZ has "third oxide" additions, reaction products of the inhibitor elements and the third oxides may also be present, as long as the reaction products meet the other requirements set forth herein.

The substrate is preferably a nickel-base superalloy in the form of a component of a gas turbine engine. Examples include a turbine blade, a turbine vane, and a turbine combustor component.

A method for fabricating an article protected by a thermal barrier coating system comprises the steps of providing a substrate having a substrate surface, and applying a thermal barrier coating system overlying the substrate. The thermal barrier coating system comprises a thermal barrier coating formed of a thermal barrier coating material arranged as a plurality of columnar grains extending generally perpendicular to the substrate surface and having grain surfaces, and a sintering inhibitor within the columnar grains but concentrated at the grain surfaces. The sintering inhibitor is a reaction product of the thermal barrier coating material and an inhibitor precursor material, which preferably comprises an inhibitor element selected from the group consisting of barium, strontium, tantalum, lanthanum, neodymium, gadolinium, niobium, and mixtures thereof, such as described above. The sintering inhibitor has a higher melting point than the operating service temperature of the turbine component, typically about 1200° C. and in some cases higher than the melting point of the thermal barrier coating material. The various types of reaction products discussed above may also be present here.

In the preferred embodiment, the thermal barrier coating is deposited, and thereafter the inhibitor precursor material is infiltrated into the thermal barrier coating. Typically, the inhibitor precursor material is thereafter reacted with the thermal barrier coating material. Infiltration may be accomplished by forming a liquid phase or gaseous phase containing the inhibitor precursor material, and contacting the liquid phase or the gaseous phase to the thermal barrier coating. In the various embodiments, a bond coat is preferably deposited on the substrate surface prior to depositing the thermal barrier coating.

The sintering-inhibitor reaction product of the thermal barrier coating material and the inhibitor precursor material provides effective inhibition of the sintering that otherwise closes the gaps between the columnar ceramic grains of the thermal barrier coating. The sintering inhibitor has a higher melting point than the operating service temperature of the thermal barrier coating, and in some cases higher than the melting point of the thermal barrier coating material, increasing its resistance to sintering together with the laterally adjacent columnar grain. The result is that the ability of the thermal barrier coating to withstand the development of thermally induced stresses is retained for an extended service lifetime. The thermal conductivity of the thermal barrier coating is also maintained at a low level for an extended period.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
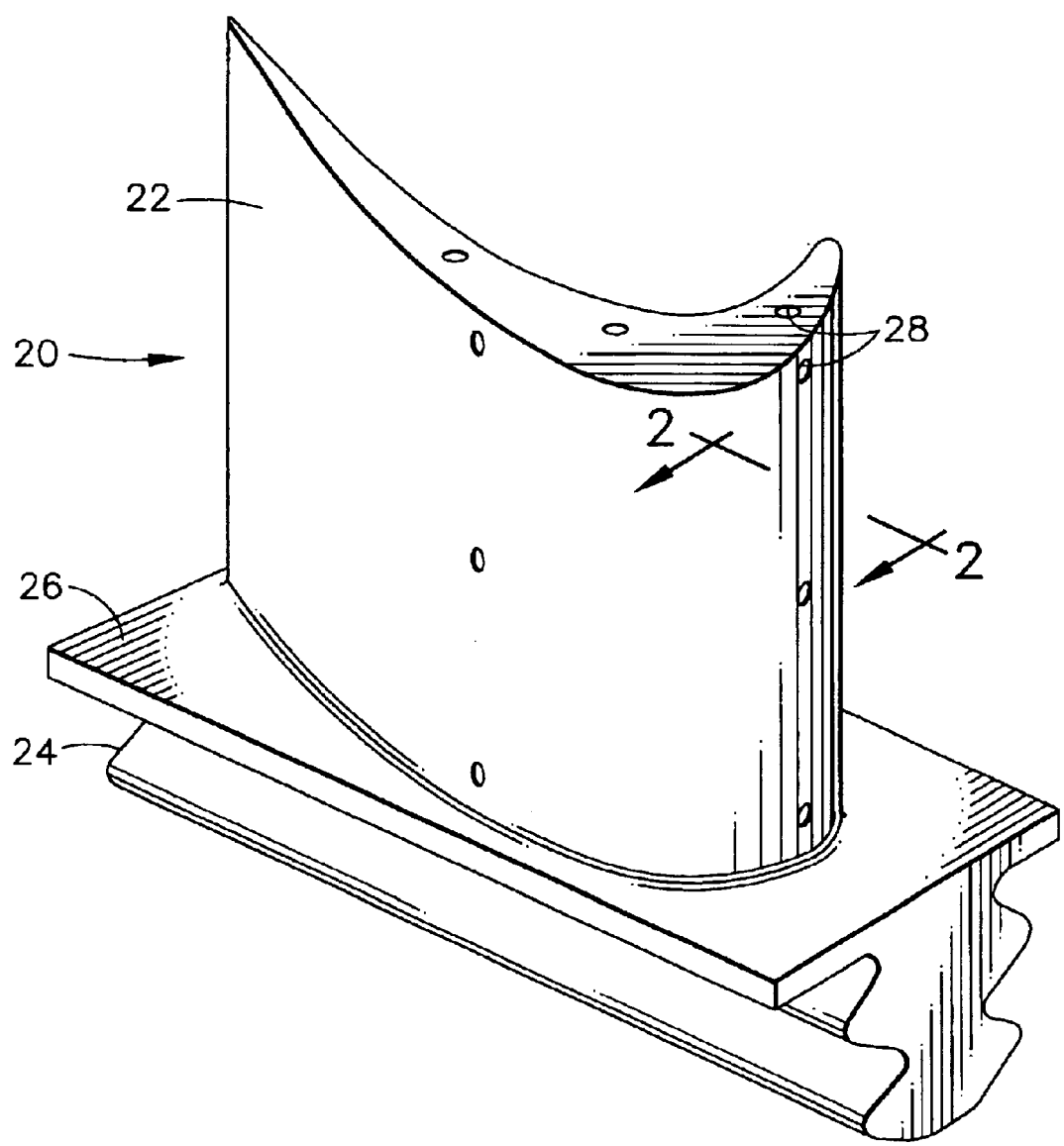
FIG. 1 is a perspective view of a gas turbine blade article having an airfoil structure.

FIG. 1 depicts a component article of a gas turbine engine such as a turbine blade or turbine vane, and in this illustration a turbine blade 20. The turbine blade 20 is formed of any operable material, but is preferably a nickel-base superalloy. The turbine blade 20 includes an airfoil section 22 against which the flow of hot exhaust gas is directed. (The turbine vane or nozzle has a similar appearance in respect to the pertinent airfoil section, but typically includes other end structure to support the airfoil.) The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of internal passages extend through the interior of the airfoil 22, ending in openings 28 in the surface of the airfoil 22. During service, a flow of cooling air is directed through the internal passages to reduce the temperature of the airfoil 22.

Figure 2:
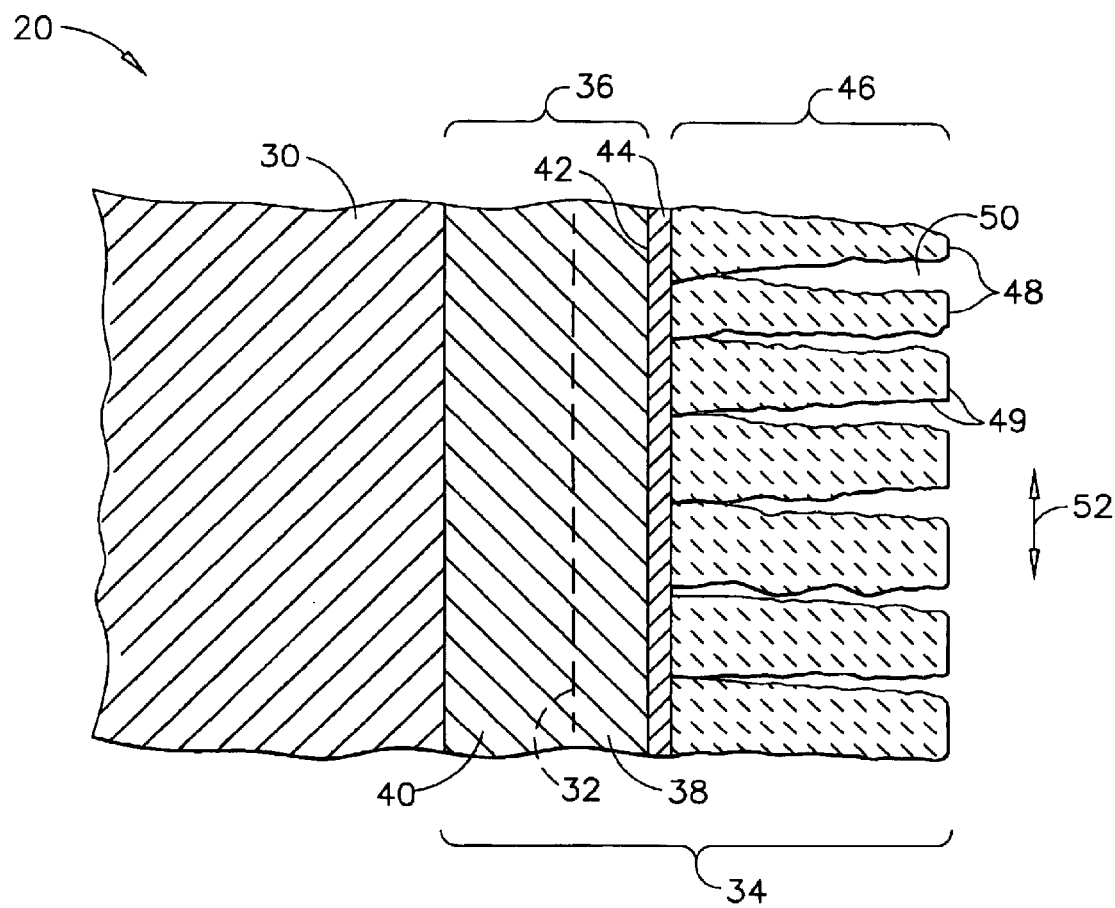
FIG. 2 is a schematic sectional view through the airfoil structure of FIG. 1, taken on lines 2—2.

FIG. 2 is a schematic sectional view, not drawn to scale, through a portion of the turbine blade 20, here the airfoil section 22. The turbine blade 20 has a body that serves as a substrate 30 with a surface 32. Overlying and contacting the surface 32 of the substrate 30, and also extending downwardly into the substrate 30, is a thermal barrier coating system 34 including a protective coating, which in this case is termed a bond coat 36. The bond coat 36 is thin and generally planar while conforming to and being bonded to the surface 32 of the substrate 30. The bond coat 36 includes an additive layer 38 and a diffusion zone 40 that is the result of interdiffusion of material from the additive layer 38 with material from the substrate 30. The process that deposits the additive layer 38 onto the surface 32 of the substrate 30 is performed at elevated temperature, so that during deposition the material of the additive layer 38 interdiffuses into and with the material of the substrate 30, forming the diffusion zone 40. The diffusion zone 40, indicated by a dashed line in FIG. 2, is a part of the bond coat 36 but extends downward into the substrate 30.

The bond coat 36 has an outwardly facing bond coat surface 42 remote from the surface 32 of the substrate 30. An alumina (aluminum oxide, or $Al_2O_3$) scale 44 forms at this bond coat surface 42 by oxidation of the aluminum in the bond coat 36 at the bond coat surface 40. A ceramic thermal barrier coating 46 overlies and contacts the bond coat surface 42 and the alumina scale 44 thereon.

Figure 3:
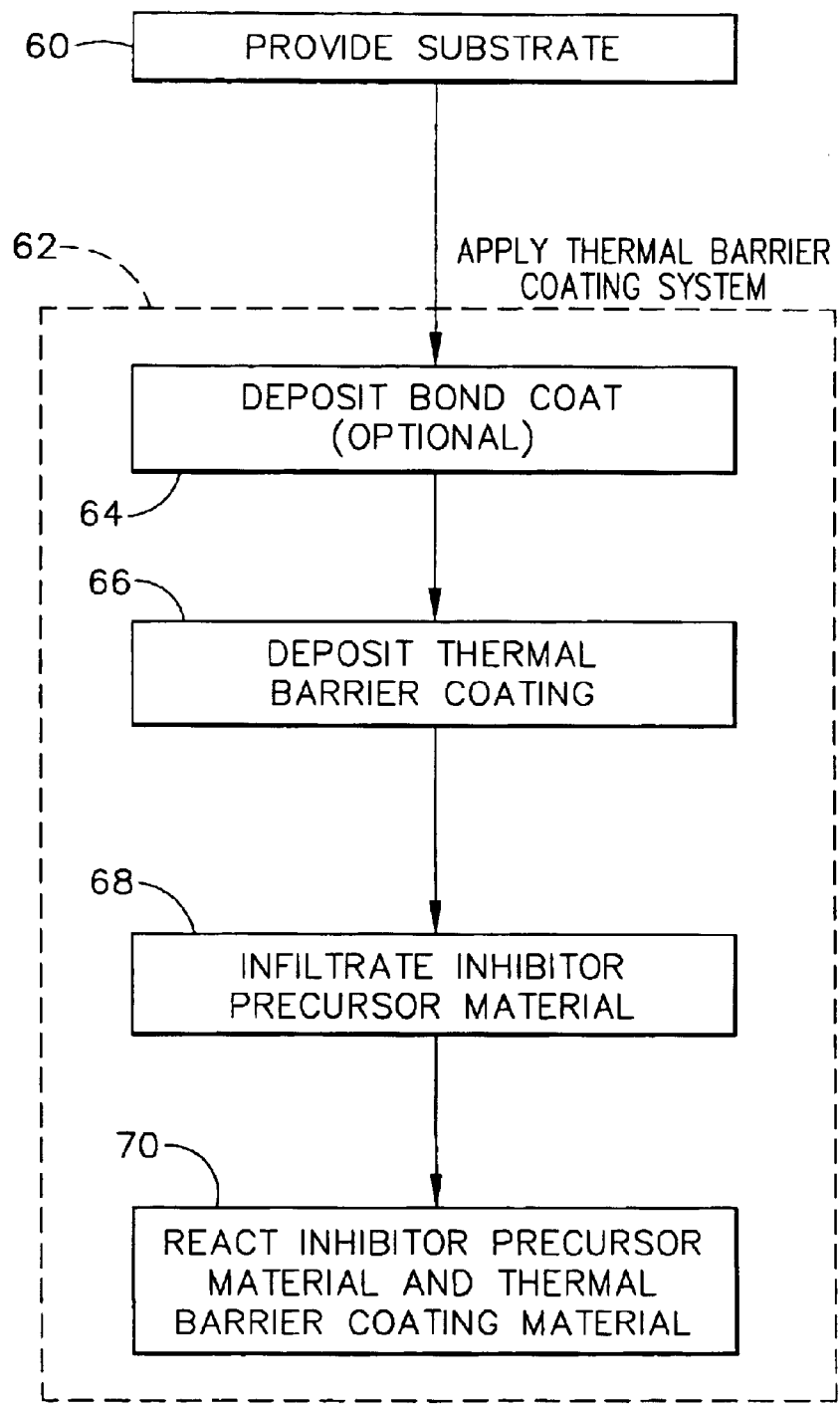
FIG. 3 is a block diagram illustrating a preferred approach for preparing the article of FIG. 1.

FIG. 3 is a block flow diagram of a preferred approach for fabricating an article. An article and thence the substrate 30 are provided, numeral 60. The article is preferably a component of a gas turbine engine such as a gas turbine blade 20 or vane (or "nozzle", as the vane is sometimes called), see FIG. 1. The article may be a single crystal article, a preferentially oriented polycrystal, or a randomly oriented polycrystal. The article is most preferably made of a nickel-base superalloy. As used herein, "nickel-base" means that the composition has more nickel present than any other element. The nickel-base superalloys are typically of a composition that is strengthened by the precipitation of gamma-prime phase or a related phase. The preferred nickel-base alloy has a composition, in weight percent, of from about 4 to about 20 percent cobalt, from about 1 to about 10 percent chromium, from about 5 to about 7 percent aluminum, from 0 to about 2 percent molybdenum, from about 3 to about 8 percent tungsten, from about 4 to about 12 percent tantalum, from 0 to about 2 percent titanium, from 0 to about 8 percent rhenium, from 0 to about 6 percent ruthenium, from 0 to about 1 percent niobium, from 0 to about 0.1 percent carbon, from 0 to about 0.01 percent boron, from 0 to about 0.1 percent yttrium, from 0 to about 1.5 percent hafnium, balance nickel and incidental impurities.

A most preferred alloy composition is Rene' N5, which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities. Other operable superalloys include, for example, Rene' N6, which has a nominal composition in weight percent of about 12.5 percent cobalt, about 4.2 percent chromium, about 1.4 percent molybdenum, about 5.75 percent tungsten, about 5.4 percent rhenium, about 7.2 percent tantalum, about 5.75 percent aluminum, about 0.15 percent hafnium, about 0.05 percent carbon, about 0.004 percent boron, about 0.01 percent yttrium, balance nickel and incidental impurities; Rene 142, which has a nominal composition, in weight percent, of about 12 percent cobalt, about 6.8 percent chromium, about 1.5 percent molybdenum, about 4.9 percent tungsten, about 6.4 percent tantalum, about 6.2 percent aluminum, about 2.8 percent rhenium, about 1.5 percent hafnium, about 0.1 percent carbon, about 0.015 percent boron, balance nickel and incidental impurities; CMSX-4, which has a nominal composition in weight percent of about 9.60 percent cobalt, about 6.6 percent chromium, about 0.60 percent molybdenum, about 6.4 percent tungsten, about 3.0 percent rhenium, about 6.5 percent tantalum, about 5.6 percent aluminum, about 1.0 percent titanium, about 0.10 percent hafnium, balance nickel and incidental impurities; CMSX-10, which has a nominal composition in weight percent of about 7.00 percent cobalt, about 2.65 percent chromium, about 0.60 percent molybdenum, about 6.40 percent tungsten, about 5.50 percent rhenium, about 7.5 percent tantalum, about 5.80 percent aluminum, about 0.80 percent titanium, about 0.06 percent hafnium, about 0.4 percent niobium, balance nickel and incidental impurities; PWA1480, which has a nominal composition in weight percent of about 5.00 percent cobalt, about 10.0 percent chromium, about 4.00 percent tungsten, about 12.0 percent tantalum, about 5.00 percent aluminum, about 1.5 percent titanium, balance nickel and incidental impurities; PWA1484, which has a nominal composition in weight percent of about 10.00 percent cobalt, about 5.00 percent chromium; about 2.00 percent molybdenum, about 6.00 percent tungsten, about 3.00 percent rhenium, about 8.70 percent tantalum, about 5.60 percent aluminum, about 0.10 percent hafnium, balance nickel and incidental impurities; and MX-4, which has a nominal composition as set forth in U.S. Pat. No. 5,482,789, in weight percent, of from about 0.4 to about 6.5 percent ruthenium, from about 4.5 to about 5.75 percent rhenium from about 5.8 to about 10.7 percent tantalum, from about 4.25 to about 17.0 percent cobalt, from 0 to about 0.05 percent hafnium, from 0 to about 0.06 percent carbon, from 0 to about 0.01 percent boron, from 0 to about 0.02 percent yttrium, from about 0.9 to about 2.0 percent molybdenum, from about 1.25 to about 6.0 percent chromium, from 0 to about 1.0 percent niobium, from about 5.0 to about 6.6 percent aluminum, from 0 to about 1.0 percent titanium, from about 3.0 to about 7.5 percent tungsten, and wherein the sum of molybdenum plus chromium plus niobium is from about 2.15 to about 9.0 percent, and wherein the sum of aluminum plus titanium plus tungsten is from about 8.0 to about 15.1 percent, balance nickel and incidental impurities. The use of the present invention is not limited to these preferred alloys, and has broader applicability.

The thermal barrier coating system 34 is applied, numeral 62. The application of the thermal barrier coating system 34 optionally but desirably includes the deposition of the bond coat 36, numeral 64. The bond coat 36 is preferably a diffusion aluminide bond coat, produced by depositing an aluminum-containing layer onto the substrate 30 and interdiffusing the aluminum-containing layer with the substrate 30 to produce the additive layer 38 and the diffusion zone 40 shown in FIG. 2. The bond coat may be a simple diffusion aluminide, or it may be a more-complex diffusion aluminide wherein another layer, preferably platinum, is first deposited upon the surface 32, and the aluminum-containing layer is deposited over the first-deposited layer. In either case, the aluminum-containing layer may be doped with other elements that modify the bond coat. The bond coat may instead be an overlay coating such as an MCrAlX coating. The terminology "MCrAlX" is a shorthand term of art for a variety of families of overlay bond coats 36 that may be employed as environmental coatings or bond coats in thermal barrier coating systems. In this and other forms, M refers to nickel, cobalt, iron, and combinations thereof, in some of these protective coatings, the chromium may be omitted. The X denotes elements such as hafnium, zirconium, yttrium, tantalum, rhenium, ruthenium, palladium, platinum, silicon, titanium, boron, carbon, and combinations thereof. Specific compositions are known in the art. Some examples of MCrAlX compositions include, for example, NiAlCrZr and NiAlZr, but this listing of examples is not to be taken as limiting. In each case, the bond coat 36 is typically from about 0.0005 to about 0.010 inch thick. Such bond coats 36 and their deposition procedures are generally known in the art.

Because the platinum-aluminide diffusion aluminide is preferred, its deposition will be described in more detail. A platinum-containing layer is first deposited onto the surface 32 of the substrate 30. The platinum-containing layer is preferably deposited by electrodeposition. For the preferred platinum deposition, the deposition is accomplished by placing a platinum-containing solution into a deposition tank and depositing platinum from the solution onto the surface 32 of the substrate 30. An operable platinum-containing aqueous solution is $Pt(NH_3)_4HPO_4$ having a concentration of about 4–20 grams per liter of platinum, and the voltage/current source is operated at about ½–10 amperes per square foot of facing article surface. The platinum first coating layer, which is preferably from about 1 to about 6 micrometers thick and most preferably about 5 micrometers thick, is deposited in 1–4 hours at a temperature of 190–200° F.

A layer comprising aluminum and any modifying elements is deposited over the platinum-containing layer by any operable approach, with chemical vapor deposition preferred. In that approach, a hydrogen halide activator gas, such as hydrogen chloride, is contacted with aluminum metal or an aluminum alloy to form the corresponding aluminum halide gas. Halides of any modifying elements are formed by the same technique. The aluminum halide (or mixture of aluminum halide and halide of the modifying element, if any) contacts the platinum-containing layer that overlies the substrate 30, depositing the aluminum thereon. The deposition occurs at elevated temperature such as from about 1825° F. to about 1975° F. so that the deposited aluminum atoms interdiffuse into the substrate 30 during a 4 to 20 hour cycle.

The ceramic thermal barrier coating 46 is deposited, numeral 66, preferably by a physical vapor deposition process such as electron beam physical vapor deposition (EBPVD). The ceramic thermal barrier coating 46 is preferably from about 0.003 to about 0.010 inch thick, most preferably about 0.005 inch thick. The ceramic thermal barrier coating 42 is preferably yttria-stabilized zirconia (YSZ), which is zirconium oxide containing from about 3 to about 12 weight percent, preferably from about 4 to about 8 weight percent, of yttrium oxide. Other operable ceramic materials may be used as well. Examples include yttria-stabilized zirconia which has been modified with additions of "third" oxides such as lanthanum oxide, ytterbium oxide, gadolinium oxide, cerium oxide, neodymium oxide, tantalum oxide, or mixtures of these oxides, which are co-deposited with the YSZ.

As illustrated schematically in FIG. 2, when prepared by a physical vapor deposition process the thermal barrier coating 46 is formed generally of a plurality of columnar grains 48 of the ceramic material that are affixed at their roots to the bond coat 36 and the alumina scale 44. The columnar grains 48 have grain surfaces 49. There are gaps 50, whose size is exaggerated in FIG. 2 for the purposes of illustration, between the grains 48 and their facing grain surfaces 49.

This morphology of the thermal barrier coating 46 is beneficial to the functioning of the thermal barrier coating. The gaps 50 allow the substrate 30, the bond coat 36, the alumina scale 44, and the thermal barrier coating 46 to expand in a transverse direction 52 that is locally parallel to the plane of the surface 32 and the bond coat 36. Absent the gaps 50, the in-plane thermal stresses (i.e., parallel to the transverse direction 52) that are induced in the thermal barrier coating 46 as the turbine blade 20 is heated and cooled are developed across the entire extent of the thermal barrier coating 46. The thermal barrier coating 46, being a ceramic, has a generally low ductility so that the accumulated stresses would be likely to cause failure. With the gaps 50 present, as illustrated, the in-plane stresses in the thermal barrier coating 46 are developed across only one or at most a group of a few of the columnar grains 48. That is, all of the grains 48 have in-plane stresses, but the magnitude of the in-plane stresses are relatively low because the strains do not accumulate over long distances. The result is that the thermal barrier coating 46 with the columnar grains 48 and gaps 50 is less likely to fail by in-plane overstressing during service. Additionally, the gaps 50 are filled with air, which when relatively stagnant between the grains 48 is an effective thermal insulator, aiding the thermal barrier coating 46 in performing its primary role.

During the exposure to elevated temperature of the turbine blade 20 during service, the facing grain surfaces 49 tend to grow toward each other, bond together, and sinter together. The size of the gap 50 is gradually reduced and eventually eliminated. The beneficial effects discussed above are thereby gradually reduced and eventually lost.

The present approach provides for a sintering inhibitor (also termed a "bonding inhibitor") within the columnar grains but having its highest concentration at the grain surfaces. The sintering inhibitor slows and preferably prevents the sintering process which reduces and eventually eliminates the gaps 50. The sintering inhibitor is a reaction product, which may or may not be a stoichiometric chemical compound, of the thermal barrier coating material and an inhibitor precursor material that is added to the thermal barrier coating 46 after its deposition. The inhibitor precursor material preferably includes an inhibitor element selected from the group consisting of barium, strontium, tantalum, lanthanum, neodymium, gadolinium, niobium, and mixtures thereof, so that the sintering inhibitor is a compound of one or more of these inhibitor elements.

Three families of reaction-product sintering inhibitors are of most interest at the present time, for the case of the preferred yttria-stabilized zirconia (YSZ) thermal barrier coating, wherein zirconia is the major oxide present. First, oxide compounds of Group II (of the periodic table) inhibitor elements such as barium and strontium reacted with the material of the thermal barrier coating form zirconates with a perovskite structure. Examples include barium-zirconium-oxide, and particularly the barium zirconate compound, and strontium-zirconium-oxide, and particularly the strontium zirconate compound. Second, oxide compounds of Group III (of the periodic table) large-cation inhibitor elements such as lanthanum, neodymium, ytterbium, and gadolinium reacted with the material of the thermal barrier coating form zirconates with a pyrochlore structure. Examples include lanthanum-zirconium-oxide, and particularly the lanthanum zirconate compound, neodymium-zirconium-oxide, and particularly the neodymium zirconate compound, ytterbium-zirconium-oxide, and particularly the ytterbium zirconate compound, and gadolinium-zirconium-oxide, and particularly the gadolinium zirconate compound. Third, oxide compounds of Group V (of the periodic table) inhibitor elements such as tantalum and niobium reacted with the material of the thermal barrier coating form tantalates and niobates of zirconium. Examples include tantalum-zirconium-oxide, and particularly zirconium tantalate compound, and niobium-zirconium-oxide, and particularly zirconium niobate compound. Although YSZ is the presently preferred material of the thermal barrier coating, 46, the present invention is operable with other thermal barrier coating materials, as long as the other requirements set forth herein are met.

Reaction product mixtures of oxides from within a single one of these families, or mixtures of oxides between these families are operable, as long as the reaction products meet the other requirements set forth herein. Reacted mixtures of oxides of one or more of these families and other oxide-formers are also operable, as long as the reaction products meet the other requirements set forth herein. Oxides of any of these inhibitor elements and including yttria, the stabilizing element in YSZ, may form, as long as the reaction products meet the other requirements set forth herein. Examples include niobium-yttrium-oxide, and particularly yttrium niobate compound, and tantalum-yttrium-oxide, and particularly yttrium zirconate compound. When the YSZ has "third oxide" additions, reaction products of the inhibitor elements and the third oxides may also be present, as long as the reaction products meet the other requirements set forth herein.

An important feature of this approach is that the melting point of the sintering inhibitor is greater than the operating temperature of the thermal barrier coating material, which is typically about 1200° C. In some preferred cases, the sintering inhibitor has a higher melting point than that of the thermal barrier coating material, reducing the tendency of the columnar grains to sinter to each other.

In a preferred approach for supplying the inhibitor precursor material to the thermal barrier coating, the inhibitor precursor material is infiltrated, numeral 68, into the thermal barrier coating 46 after the thermal barrier coating has been deposited in step 66. The inhibitor precursor material—preferably including one or more of the inhibitor elements listed above—is provided in a nonsolid (liquid or gaseous) form that can flow into the gaps 50. In one approach, the inhibitor precursor material is provided as a liquid-soluble species, such as barium hydroxide, strontium hydroxide, or tantalum hydroxide. The liquid-soluble species is dissolved in the appropriate solvent, water in the case of the hydroxides or other liquids in the case of other forms of the inhibitor precursor material. The thermal barrier coating 46 is contacted to the solution so that the solution penetrates into the gaps 50. The solvent is then removed by evaporation or other approach, leaving the inhibitor precursor material at the surfaces 49 of the columnar grains 48.

Alternatively, the inhibitor precursor material may be provided as a gaseous inhibitor precursor material. In this embodiment, the inhibitor precursor material is preferably deposited by a non-line-of-sight approach such as metal-organic chemical vapor deposition (MOCVD), wherein the inhibitor material is provided as an organic gaseous compound which is infiltrated into the gaps 50 of the thermal barrier coating 46. The inhibitor precursor material is deposited onto the surfaces 49 from this gas.

After the inhibitor precursor material is deposited upon the surfaces 49 from either a gaseous or liquid source, the inhibitor precursor material and the thermal barrier coating material are reacted together, numeral 70. The reaction is preferably accomplished by heating the thermal barrier coating 46 to a temperature whereat a reaction and interdiffusion occur. For the case of a YSZ thermal barrier coating material, the use of the above-discussed inhibitor elements results in reaction products and compounds as listed above as the sintering inhibitor. The reaction step 70 typically occurs after the infiltration step 68, although under some circumstances, such as where the infiltrate is provided as a gaseous compound, there may be reaction 70 concurrent with the infiltration 68.

Figure 4:
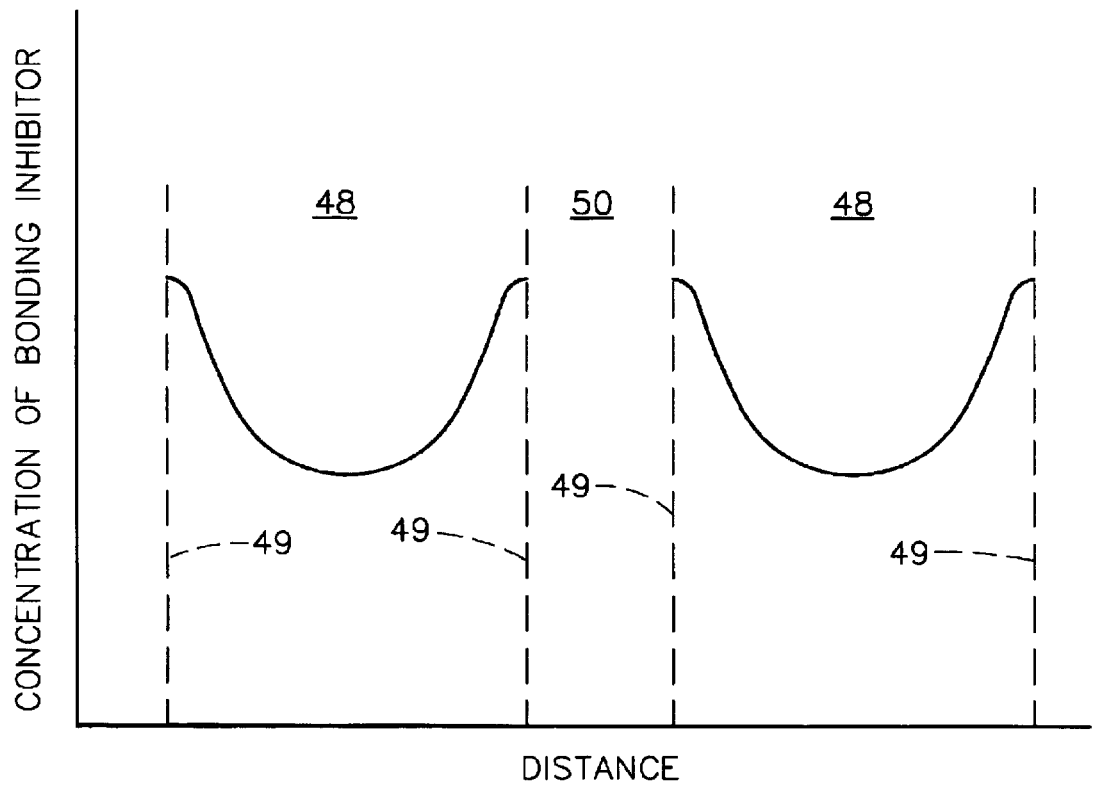
FIG. 4 is a schematic graph of the concentration of the sintering inhibitor as a function of position in the columnar grains of the thermal barrier coating.

FIG. 4 is a schematic representation of the concentration of the sintering inhibitor as a function of position within the columnar grains 48. The concentration of the sintering inhibitor reaction product is greatest at and near the surfaces 49, where it is most needed to inhibit sintering between the columnar grains 48, and decreases with increasing distance into the columnar grains 48. Depending upon the through-thickness dimensions of the columnar grains 48 and conditions of heating and time at temperature, the sintering inhibitor reaction product may be found throughout the entire thickness of the columnar grains 48 but with a decreasing concentration with increasing distance from the grain surfaces 49, as shown, or it may be zero at locations approaching the through-thickness centers of the columnar grains 48. The sintering inhibitor may be co-deposited with the thermal barrier coating material to produce a general background level of the sintering inhibitor, and also deposited by the infiltration approach discussed above to produce the higher surface concentration.

The reaction product may be a compound of specific composition, such as barium zirconate, strontium zirconate, or zirconium tantalate, but more generally it is a combination that does not have a specific compound stoichiometry. Because the composition of the sintering inhibitor may be continuously variable, it is not just a surface layer or sheath on the columnar grains 48. The compositional variation is therefore as indicated in FIG. 4, with the concentration of the sintering inhibitor greatest at the grain surfaces 49 and lesser elsewhere, as desired for inhibition of sintering and bonding at the grain surfaces 49. If the concentration of the sintering inhibitor were uniform across the entire grain 48 and of sufficiently high concentration to inhibit sintering, it would alter the other properties of the basic material of the thermal barrier coating. The high melting point of the sintering inhibitor and/or its high stability results in this inhibition of sintering.

The reaction step 70 may be performed as a step of the fabrication process, or it may be accomplished when the protected article is heated to elevated temperature in service. Typically, when the reaction step 70 is performed as a step in the fabrication process, it is at a temperature of about 600° C. to about 1200° C. and for a reaction time of from about 30 minutes to about 4 hours.

To demonstrate the operability of the present approach, compounds of tantalum, barium, and strontium were infiltrated into porous thermal barrier coatings. The specimens of substrates with thermal barrier coatings deposited thereon were placed into a vacuum cell. The thermal barrier coatings were yttria-stabilized zirconia containing 7 weight percent yttrium (termed "7YSZ"). A saturated solution of the metallic precursor material in a solvent was added to the cell to cover the specimens with 1 inch of liquid. Precursor solutions that were tested included $Ba(OH)_2$ in water, $BaCl_2$ in water, $Sr(OH)_2$ in water, $SrCl_2$ in water, $Ta(OEt)_5$ in ethanol, and $Ta(OEt)_5$ in i-propanol. The cell was attached to a vacuum source and evacuated to approximately 100 millitorr of pressure to remove any gas in the TBC gaps 50. During this operation, the temperature of the cell fell due to the evaporative cooling of the solvent. After 3 minutes, the cell was removed from the vacuum source and vented to atmospheric pressure to backfill the TBC gaps with liquid. The evacuation/venting cycle was repeated two additional times to ensure that the gaps were filled with precursor solution. The specimens were removed from the cell and allowed to dry for a minimum of two hours. The specimens were thereafter placed into an oven and heated to 900° C. for 4 hours. In some cases, the entire evacuation/venting/heating cycle was repeated to increase the amount of the precursor material deposited at the surfaces 42.

The change in thermal conductivity of several of the specimens were tested to evaluate the effect of the sintering inhibitor on the stability of the thermal conductivity. Specimens were prepared as described above, and their thermal conductivities ko tested. In each case, duplicate tests were performed and are reported. To test the stability of the thermal conductivity of the thermal barrier coating, the specimens were heated to 1200° C. for 2 hours in air. The thermal conductivities kf were then tested. The differences in conductivities $\Delta k = kf - ko$ and the percentage changes, % change, were determined. The results are reported in the following table, along with results for the same tests of a baseline sample of as-deposited 7YSZ, which was as-deposited and was not infiltrated according to the present approach.

| Sample | ko | kf | Δk | % change |
| --- | --- | --- | --- | --- |
| $Ba(OH)_2$/water | 1.62 | 1.62 | 0 | 0 |
| $Ba(OH)_2$/water | 1.68 | 1.67 | −0.01 | −.60 |
| $Sr(OH)_2$/water | 1.83 | 1.98 | 0.15 | 8.20 |
| $Sr(OH)_2$/water | 1.88 | 1.98 | 0.10 | 5.32 |
| $Ta(OEt)_5$/ethanol | 1.72 | 1.90 | 0.18 | 10.47 |
| $Ta(OEt)_5$/ethanol | 1.66 | 1.74 | 0.08 | 4.82 |
| $BaCl_2$/water | 1.65 | 1.43 | −0.22 | −13.33 |
| $BaCl_2$/water | 1.44 | 1.49 | 0.05 | 3.47 |
| $SrCl_2$/water | 1.65 | 1.73 | 0.08 | 4.85 |
| $SrCl_2$/water | 1.63 | 1.71 | 0.08 | 4.91 |
| 7YSZ (baseline) | 1.36 | 1.60 | 0.24 | 17.6 |

In all cases, the infiltrated specimens had a smaller percentage change in the thermal conductivity after the testing than did the baseline specimen, demonstrating the stabilizing effect of the sintering inhibitor.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An article protected by a thermal barrier coating system, comprising:
   a substrate having a substrate surface; and
   a thermal barrier coating system overlying the substrate, the thermal barrier coating system comprising
      a thermal barrier coating formed of a thermal barrier coating material arranged as a plurality of columnar grains extending generally perpendicular to the substrate surface and having grain surfaces, and
      a sintering inhibitor within the columnar grains but concentrated at the grain surfaces, wherein an inhibitor precursor material comprises an element selected from the group consisting of barium, strontium, tantalum, niobium, and mixtures thereof, wherein the sintering inhibitor is a reaction product of the thermal barrier coating material and the inhibitor precursor material, and wherein the sintering inhibitor has a melting point of at least about 1200° C.

2. The article of claim 1, wherein the substrate comprises a nickel-base superalloy.

3. The article of claim 1, wherein the substrate comprises a component of a gas turbine engine.

4. The article of claim 1, wherein the sintering inhibitor has a higher melting point than the thermal barrier coating material.

5. The article of claim 1, wherein the substrate comprises an article selected from the group consisting of a turbine blade, a turbine vane, and a combustor.

6. The article of claim 1, wherein the thermal barrier coating system further comprises
   a bond coat disposed between the substrate and the thermal barrier coating.

7. The article of claim 6, wherein the bond coat is selected from the group consisting of a diffusion aluminide and an aluminum-containing overlay coating.

8. The article of claim 1, wherein the thermal barrier coating comprises yttria-stabilized zirconia.

9. The article of claim 1, wherein the thermal barrier coating comprises yttria-stabilized zirconia modified with the addition of a third oxide selected from the group consisting of barium oxide, strontium oxide, lanthanum oxide, ytterbium oxide, gadolinium oxide, cerium oxide, neodymium oxide, tantalum oxide, and mixtures thereof.

10. The article of claim 1, wherein the sintering inhibitor comprises an oxide reaction product of barium.

11. The article of claim 1, wherein the sintering inhibitor comprises an oxide reaction product of strontium.

12. The article of claim 1, wherein the sintering inhibitor comprises an oxide reaction product of tantalum.

13. The article of claim 1, wherein the sintering inhibitor comprises an oxide reaction product of niobium.

14. A method for fabricating an article protected by a thermal barrier coating system, comprising the steps of
   providing a substrate having a substrate surface; and
   applying a thermal barrier coating system overlying the substrate by the steps of
      depositing onto the substrate surface a thermal barrier coating system comprising a thermal barrier coating material arranged as a plurality of columnar grains extending generally perpendicular to the substrate surface and having grain surfaces and gaps between the columnar grains, and
      producing a sintering inhibitor within the columnar grains but concentrated at the grain surfaces, wherein the sintering inhibitor has a higher melting point than the thermal barrier coating material, and wherein the step of producing includes the steps of
         liquid phase infiltrating an inhibitor precursor material into the gaps of the thermal barrier coating, wherein the step of infiltrating comprises the steps of
            forming a liquid solution containing the inhibitor precursor material dissolved in a solvent, and
            contacting the liquid solution to the thermal barrier coating, and
         chemically reacting the infiltrated inhibitor precursor material and the thermal barrier coating material to form the sintering inhibitor.

15. The method of claim 14, wherein the step of applying includes the steps of
   depositing a bond coat overlying the substrate, and thereafter
   depositing the thermal barrier coating overlying the bond coat.

16. The method of claim 14, wherein the step of applying includes the step of
   providing an inhibitor precursor material comprising an inhibitor element selected from the group consisting of barium, strontium, tantalum, lanthanum, neodymium, ytterbium, gadolinium, niobium, and mixtures thereof.

17. A method for fabricating an article protected by a thermal barrier coating system, comprising the steps of
   providing a substrate having a substrate surface; and
   depositing onto the substrate surface a thermal barrier coating formed of a thermal barrier coating material arranged as a plurality of columnar grains extending generally perpendicular to the substrate surface with gaps between the columnar grains, and
   liquid phase infiltrating an inhibitor precursor material into the gaps of the thermal barrier coating, wherein the step of infiltrating comprises the steps of
      forming a liquid solution containing the inhibitor precursor material dissolved in a solvent, and
      contacting the liquid solution to the thermal barrier coating, and
   chemically reacting the infiltrated inhibitor precursor material and the thermal barrier coating material to form a sintering inhibitor.

18. The method of claim 17, wherein the step of liquid phase infiltrating includes the step of
   providing an inhibitor precursor material comprising an inhibitor element selected from the group consisting of barium, strontium, tantalum, lanthanum, neodymium, ytterbium, gadolinium, niobium, and mixtures thereof.

* * * * *